United States Patent
Lee et al.

(10) Patent No.: US 8,014,227 B2
(45) Date of Patent: Sep. 6, 2011

(54) BURST LENGTH CONTROL CIRCUIT AND SEMICONDUCTOR MEMORY DEVICE USING THE SAME

(75) Inventors: Joo Hyeon Lee, Bucheon-si (KR); Yin Jae Lee, Icheon-si (KR)

(73) Assignee: Hynix Semiconductor Inc., Icheon—si (KR)

( * ) Notice: Subject to any disclaimer, the term of this patent is extended or adjusted under 35 U.S.C. 154(b) by 276 days.

(21) Appl. No.: 12/319,063

(22) Filed: Dec. 30, 2008

(65) Prior Publication Data
US 2010/0085819 A1    Apr. 8, 2010

(30) Foreign Application Priority Data
Oct. 6, 2008   (KR) .................. 10-2008-0097884

(51) Int. Cl.
*G11C 8/00* (2006.01)
(52) U.S. Cl. .............. 365/233.18; 365/233.13; 365/191; 365/189.05; 365/189.07
(58) Field of Classification Search ............ 365/189.05, 365/189.11, 191, 233.11, 233.13, 233.18
See application file for complete search history.

(56) References Cited

U.S. PATENT DOCUMENTS

| | | | | |
|---|---|---|---|---|
| 5,652,724 A | * | 7/1997 | Manning | 365/189.05 |
| 5,764,584 A | * | 6/1998 | Fukiage et al. | 365/230.03 |
| 5,973,993 A | | 10/1999 | Morgan | |
| 6,646,955 B2 | * | 11/2003 | Toda | 365/233.18 |
| 6,771,558 B2 | * | 8/2004 | Kim | 365/233.18 |
| 2006/0143330 A1 | | 6/2006 | Kiehl | |

FOREIGN PATENT DOCUMENTS

| | | |
|---|---|---|
| JP | 7-98981 | 4/1995 |
| KR | 10-1999-0054399 | 7/1999 |

* cited by examiner

*Primary Examiner* — Pho M Luu
*Assistant Examiner* — Tha-O Bui
(74) *Attorney, Agent, or Firm* — John P. White; Cooper & Dunham LLP

(57) ABSTRACT

A burst length control circuit capable of performing read and write operations in high speed according to a burst length and a semiconductor memory device using the same includes a clock signal generating unit for generating first and second internal clock signals from a clock signal in response to a first and second burst signals, a control signal generating unit for driving in response to the first and second internal clock signals, wherein the control signal generating unit for generating first and second control signals, enable sections of the first and second control signals being controlled according to the first and second burst signals at a read operation or write operation, and a burst termination signal generating unit for generating a burst termination signal in response to the first and second burst signals. The first control signal is disabled in response to the burst termination signal.

26 Claims, 15 Drawing Sheets

BURST LENGTH CONTROL CIRCUIT AND SEMICONDUCTOR MEMORY DEVICE USING THE SAME

TECHNICAL FIELD

The present disclosure relates to a semiconductor memory device and, more particularly, to a burst length control circuit capable of performing read and write operations in high speed according to a burst length and a semiconductor memory device using the same.

BACKGROUND

As well-known to those skilled in the art, DDR (Double Data Rate), in which data are input and output in synchronization with rising and falling edges of a clock signal at the data I/O operation, operates in a burst mode in order to execute consecutive read or write operations.

In the burst mode, the burst length of BL4 or BL8 is typically used. Here, BL4 is set up to four (4) in the burst length so that 4-bit data are input and output according to one command signal. On the other hand, in the burst length of BL8, 8-bit data are input and output according to one command signal.

Meanwhile, a prefetch technique is used in the DDR. Typically, 2-bit prefetch is employed in the DDR so that two bits of the data are consecutively output and 4-bit prefetch is employed in the DDR2 so that four bits of the data are consecutively output.

FIG. 1 is a detailed circuit diagram illustrating a conventional burst length control circuit which is used in the DDR2 in which a 4-bit prefetch.

As shown in FIG. 1, the conventional burst length control circuit receives a burst signal SBL4 for setting up the burst length, and a read signal IRDP which is activated by an external read command, and a write signal IWTP which is activated by an external write command, and then generates a buffer control signal FYBST and a column control signal IYBST. Here, the buffer control signal FYBST is a signal to control an enable section of a data I/O buffer and the column control signal IYBST is a signal to produce a column select signal YI for data transfer between a data I/O line and a sense amplifier.

Hereinafter, the burst length control circuit of FIG. 1 will be described divides into burst lengths of BL4 and BL8.

First, in the burst length of BL4, since the burst signal SBL4 is at a high voltage level, a PMOS transistor P10 is turned on such that a pull-up operation is carried out at a node nd10. A signal on the node nd10 is transferred through transfer gates T10, T11 and T12, that are selectively turned on in response to a clock signal BCKB, so that both the buffer control signal FYBST and the column control signal IYBST are set up to a low level. In the case where both the buffer control signal FYBST and the column control signal IYBST are set up to a low level, the data I/O buffer is maintained in a disable state and the column select signal YI is not produced. Basically, in the case of the DDR2 in which 4-bit prefetch is applied to, 4-bit data are output through the data I/O buffer, regardless of the control of the buffer control signal FYBST and the column control signal IYBST.

Next, in the burst length of BL8, the burst signal SBL4 is at a low voltage level. At this time, since the node nd10 is initialized at a high level by a reset signal RST and a node nd12 is also initialized at a high level by the transfer gate T10 which is turned on in response to the clock signal BCKB, a high level signal is output by a NAND gate ND11. When a NMOS transistor N10 is turned on in response to both the burst signal SBL4 of a low level and the high level signal of the NAND gate ND11 and a NMOS transistor N11 is turned on in response to write signal IWTP or a NMOS transistor N12 is turned on in response to read signal IRDP, the node nd10 is pull-down driven to a low level. An output signal of the node nd10 is transferred by the transfer gates T10, T11 and T12, which are selectively turned on in response to the clock signal BCKB, so that the buffer control signal FYBST and the column control signal IYBST transit to a high level.

At this time, the enable section of the buffer control signal FYBST and the column control signal IYBST is determined by a transition section of the voltage level on the node nd12. In more detail, the signal on the node nd10, which is pull-down driven to a low level by the turned-on NMOS transistor N10, is transferred to the node nd12 by the transfer gate T10 which is turned on in response to a falling edge of the clock signal BCKB. If the low level signal on the node nd12 is input at a rising edge of the clock signal BCKB, the NAND gate ND11 outputs a low level signal and the node nd10 is pull-up driven to a high level by the turned-on PMOS transistor P10. The high level signal on the node nd10 is transferred to the node nd12 by the transfer gate T10 which is turned on in response to a falling edge of the clock signal BCKB so that the node nd12 transits to a high level. As mentioned above, since the node nd12 is maintained at a low level during one period (1tCK) of the clock signal BCKB, the enable section of the buffer control signal FYBST and the column control signal IYBST is also set up to the one period (1tCK) of the clock signal BCKB.

If the column control signal IYBST is enabled at a high level during one period (1tCK) of the clock signal BCKB, the column select signal YI is generated to consecutively input and output the 4-bit data and, if the buffer control signal FYBST is enabled at a high level during one period (1tCK) of the clock signal BCKB, the data I/O buffer is enabled to consecutively input and output the 4-bit data. As mentioned above, basically, in the case of the DDR2 in which 4-bit prefetch is applied to, since 4-bit data are output through the data I/O buffer, regardless of the control of the buffer control signal FYBST and the column control signal IYBST, the 8-bit data are consecutively input and output in the burst length of BL8.

As illustrated above, in the conventional burst control circuit of DDR2, the burst lengths of BL4 and BL8 are controlled by the burst signal SBL4. However, the burst length of BL16 is not supported by it.

SUMMARY

In an aspect of the present disclosure, a burst length control circuit and a semiconductor memory device using the same are provided that are capable of performing read and write operations in high speed by supporting a burst length of BL16 in DDR2.

In an exemplary embodiment, a burst length control circuit includes a clock signal generating unit for generating first and second internal clock signals from a clock signal in response to a first and second burst signals, a control signal generating unit for driving in response to the first and second internal clock signals, wherein the control signal generating unit for generating first and second control signals of which enable sections are controlled according to the first and second burst signals at a read operation or write operation, and a burst termination signal generating unit for generating a burst termination signal in response to the first and second burst signals, wherein the first control signal is disabled in response to the burst termination signal.

In another exemplary embodiment, a semiconductor memory device includes a burst length control circuit driven by at least one internal clock signal, wherein the burst length control circuit generates first and second control signals, of which enable sections are controlled according to a burst mode, at a read operation or write operation, and wherein the first control signal is disabled in response to a burst termination signal which is produced according to the burst mode, and a data I/O control unit for controlling a data I/O operation in response to the first and second control signals.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, examples and exemplary embodiments of the present disclosure will be described with reference to accompanying drawings. However, the examples and embodiments are for illustrative purposes only and are not intended to limit the scope of the invention.

Figure 1:
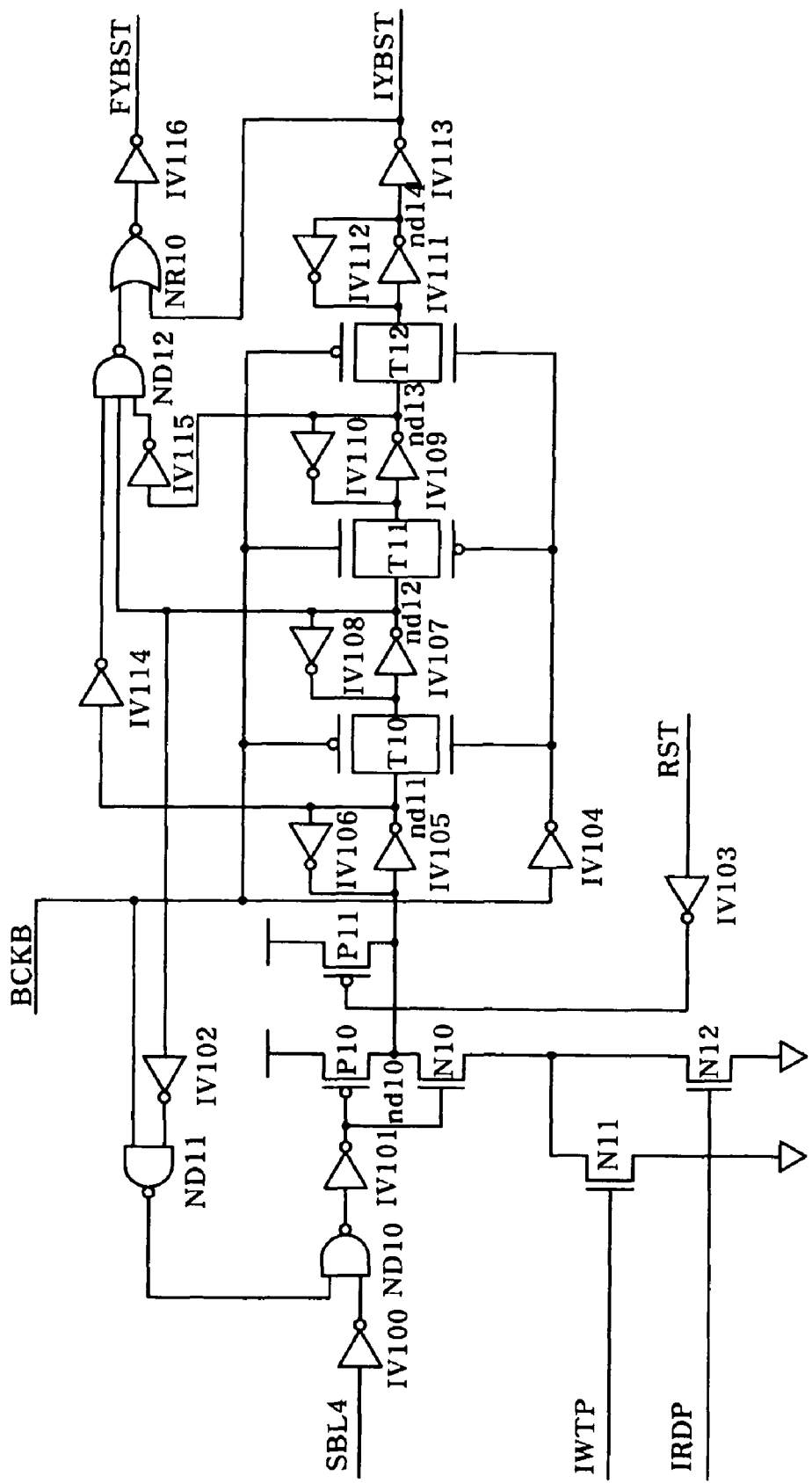
FIG. 1 is a detailed circuit diagram illustrating a conventional burst length control circuit which is used in the DDR2 in which a 4-bit prefetch.
Figure 2:
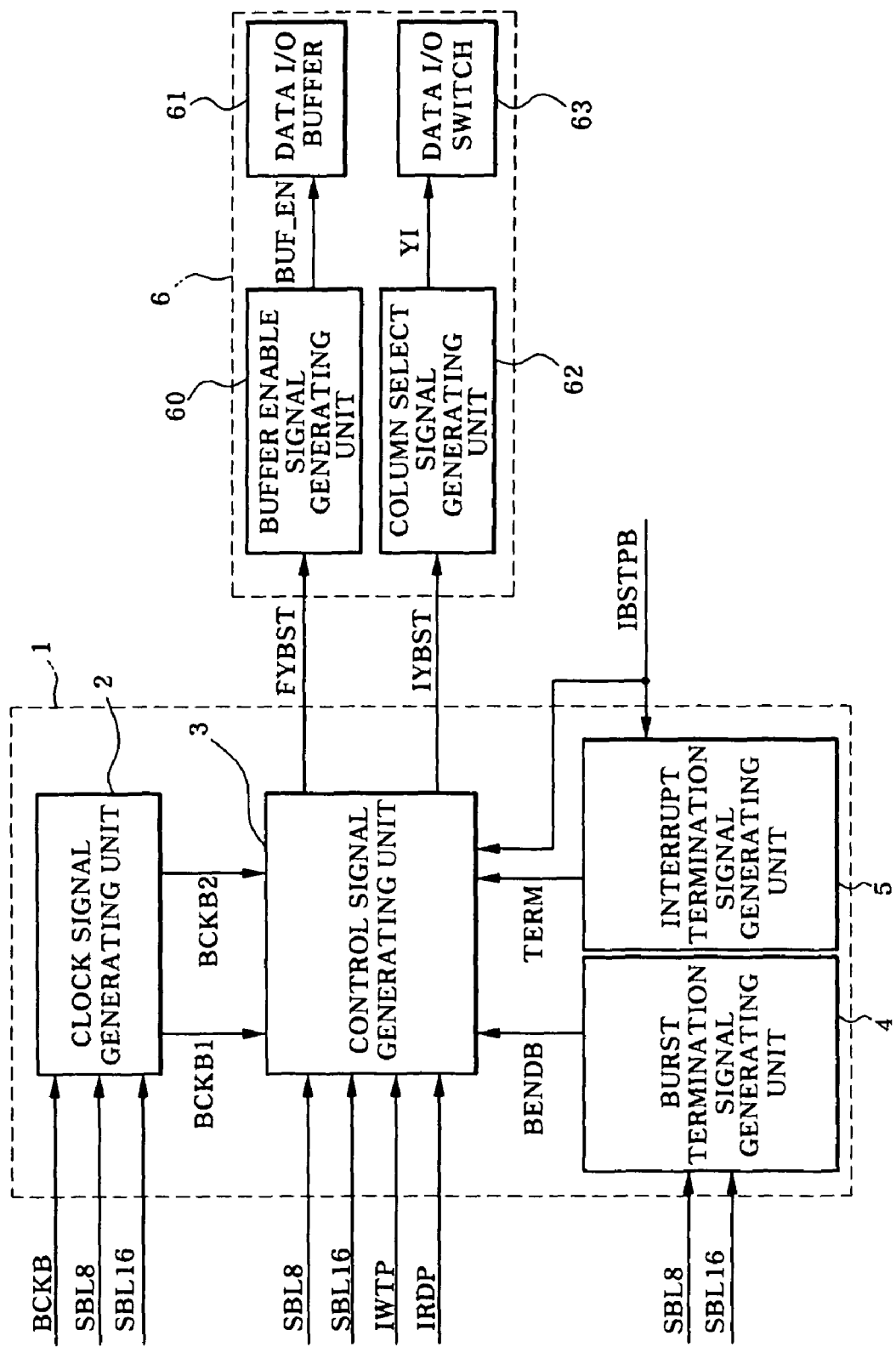
FIG. 2 is a block diagram illustrating an example of a structure of a burst length control circuit according to an exemplary embodiment of the present disclosure.

FIG. 2 is a block diagram illustrating a structure of an example of a burst length control circuit according to an exemplary embodiment of the present disclosure.

As shown in FIG. 2, the burst length control circuit according to an exemplary embodiment of the present disclosure includes a burst length control circuit 1 and a data I/O control unit 6. The burst length control circuit 1 includes a clock signal generating unit 2, a control signal generating unit 3, a burst termination signal generating unit 4, and an interrupt termination signal generating unit 5. The data I/O control unit 6 includes a buffer enable signal generating unit 60, a data I/O buffer 61, a column select signal generating unit 62, and a data I/O switch 63.

Figure 3:
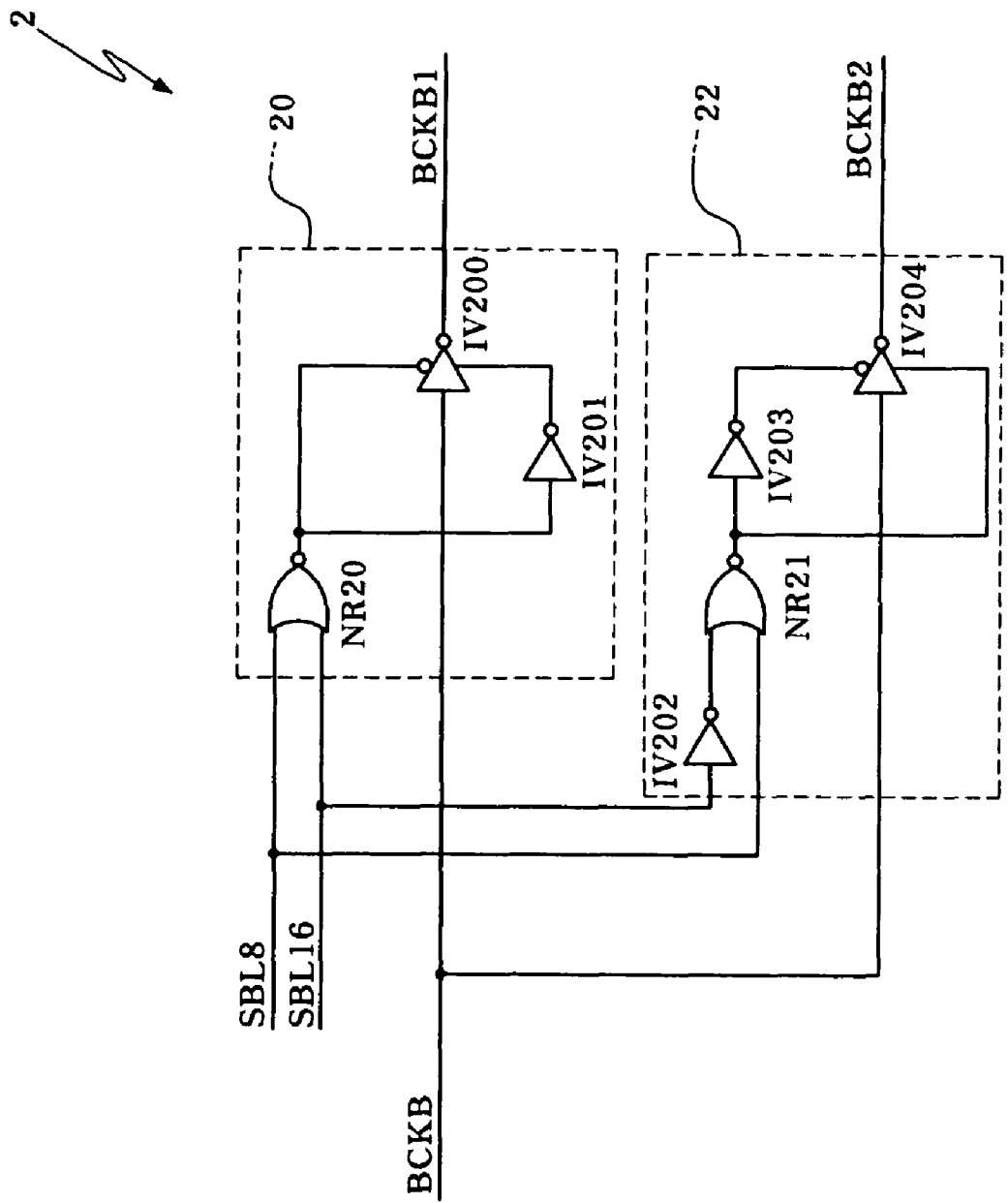
FIG. 3 is a detailed circuit diagram illustrating an example of a structure of a clock signal generating unit included in the burst length control circuit of FIG. 2.

As shown in FIG. 3, the clock signal generating unit 2 includes a first transfer unit 20 and a second transfer unit 22. The first transfer unit 20 includes a NOR gate NR20 for NORing a first burst signal SBL8 and a second burst signal SBL16 and an inverter IV200 to transfer a clock signal BCKB, as a first internal clock signal BCKB1, in response to an output signal of the NOR gate NR20. The second transfer unit 22 includes a NOR gate NR21 for NORing a first burst signal SBL8 and an inverted signal of the second burst signal SBL16 and an inverter IV204 to transfer the clock signal BCKB, as a second internal clock signal BCKB2, in response to an output signal of the NOR gate NR21. Here, the first burst signal SBL8 is enabled at a high level in the burst length of BL8, and the second burst signal SBL16 is enabled at a high level in the burst length of BL16.

The clock signal generating unit 2 does not transfer the clock signal BCKB, as the first internal clock signal BCKB1 or the second internal clock signal BCKB2, in the burst length of BL4, but transfers the clock signal BCKB, as the first internal clock signal BCKB1, in the burst length of BL8 and transfers the clock signal BCKB, as the first internal clock signal BCKB1 and the second internal clock signal BCKB2, in the burst length of BL16. In more detail, in the burst length of BL4, the inverters IV200 and IV204 are turned off so that the clock signal BCKB is not transferred as the first internal clock signal BCKB1 or the second internal clock signal BCKB2. In the burst length of BL8, only the inverter IV200 is turned on so that the clock signal BCKB is transferred as the first internal clock signal BCKB1. In the burst length of BL16, the inverters IV200 and IV204 are turned on so that the clock signal BCKB is transferred as the first internal clock signal BCKB1 and the second internal clock signal BCKB2.

Figure 4:
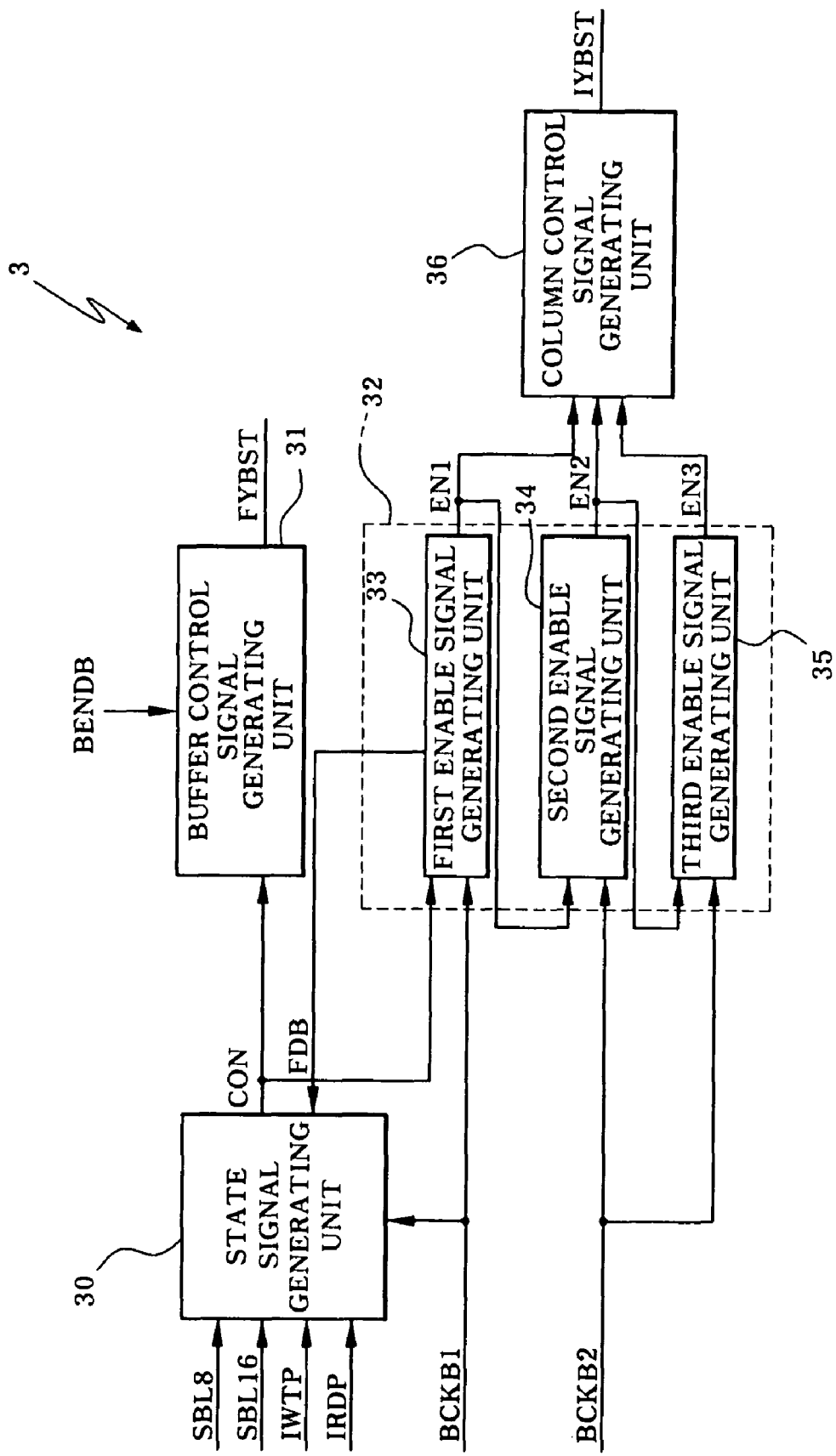
FIG. 4 is a block diagram illustrating an example of a structure of a control signal generating unit included in the burst length control circuit of FIG. 2.

As shown in FIG. 4, the control signal generating unit 3 includes a state signal generating unit 30, a buffer control signal generating unit 31, an enable signal generating unit 32, and a column control signal generating unit 36. The enable signal generating unit 32 includes a first enable signal generating unit 33, a second enable signal generating unit 34, and a third enable signal generating unit 35.

Figure 5:
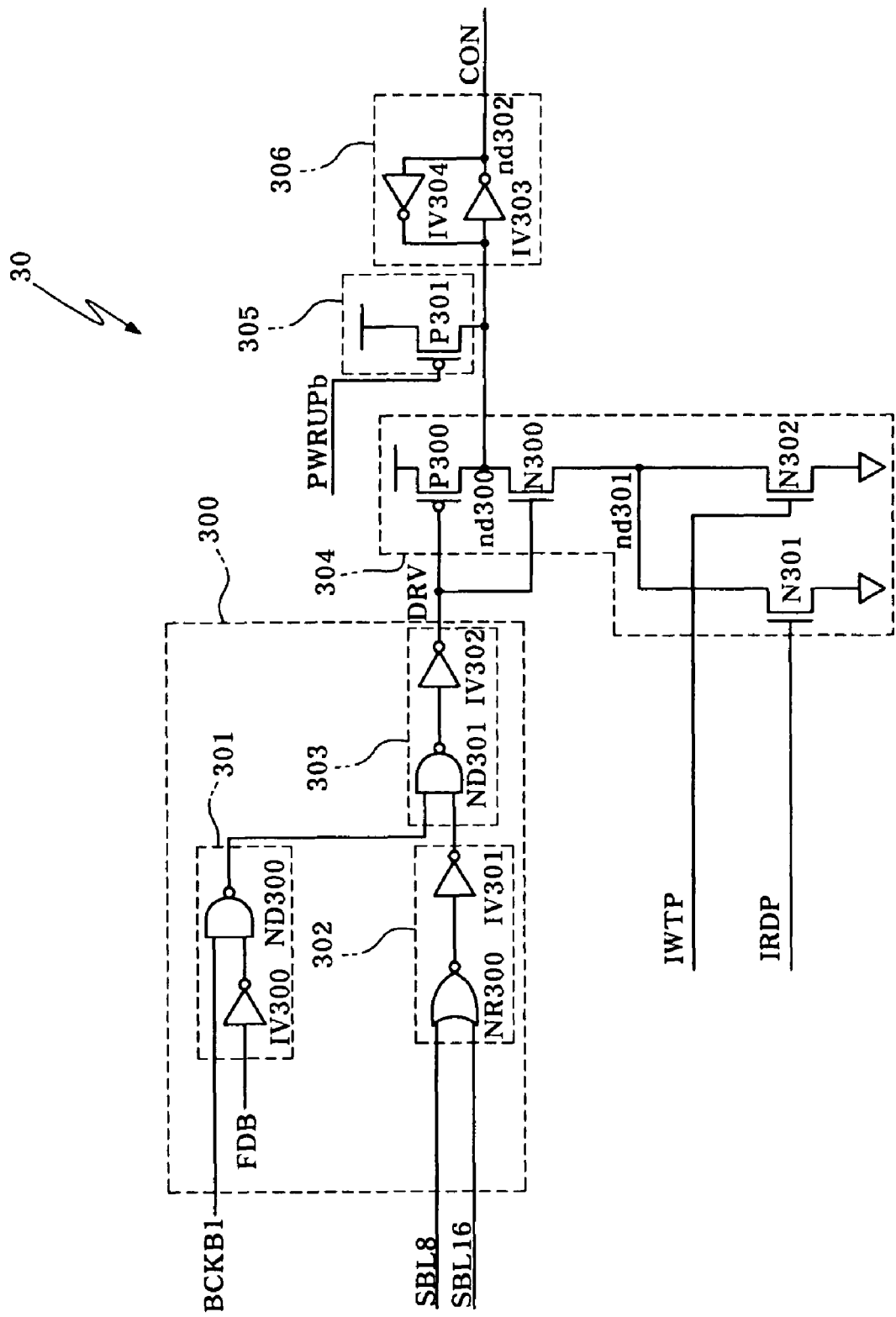
FIG. 5 is a detailed circuit diagram illustrating an example of a structure of a state signal generating unit included in the control signal generating unit of FIG. 4.

As shown in FIG. 5, the state signal generating unit 30 includes a driving signal generating unit 300, a state signal driving unit 304, a PMOS transistor P301, and a latch unit 306. The PMOS transistor P301 initializes a node nd300 at a high level in response to a power-up signal PWRUPb which is enabled at a low level during a power-up section. The latch unit 306 is coupled between the node nd300 and a node nd302 and outputs a state signal CON by latching a signal on the node nd300.

The driving signal generating unit 300 includes a logic unit 301 having a NAND gate ND300 for NANDing the first internal clock signal BCKB1 and an inverted signal of a feedback signal FDB from the first enable signal generating unit 33, a logic unit 302 for performing an OR operation on the first burst signal SBL8 and the second burst signal SBL16, and a logic unit 303 for generating a driving signal DRV by ANDing output signals of the logic units 301 and 302. Here, the feedback signal FDB has the same voltage as a signal generated by delaying the inverted signal of the feedback signal FDB by a half period (0.5tCK) of the first internal clock signal BCKB1.

The state signal driving unit 304 includes a PMOS transistor P300 for performing a pull-up driving operation at the node nd300 in response to the driving signal DRV, a NMOS transistor N300 which is coupled between the node nd300 and a node nd301 and then turned on in response to the driving signal DRV, a NMOS transistor N301 for performing a pull-down driving operation at the node nd301 in response to a read signal IRDP which is enabled at a high level at the read operation, and a NMOS transistor N302 for performing a pull-down driving operation at the node nd301 in response to a write signal IWTP which is enabled at a high level at the write operation.

The driving signal generating unit 300, as mentioned above, generates the driving signal DRV, which is enabled at a high level during one period (1tCK) of the first internal clock signal BCKB1, in the case where the read operation or write operation is executed in the burst length of BL8 or BL16. In more detail, in the case where the first burst signal SBL8 or the second burst signal SBL16 is input at a high level and the read signal IRDP or the write signal IWTP is input at a high level, the voltage level on the node nd300 transits to a low level so that the state signal CON is enabled at a high level. Since the state signal CON of the high level transits the the feedback signal FDB to a low level after a half period (0.5tCK) of the first internal clock signal BCKB1 and the logic unit 301 outputs a low level signal after another half period (0.5tCK) of the first internal clock signal BCKB1, the state signal CON transits to a low level. That is, the state signal CON is enabled at a high level during one period (1tCK) of the first internal clock signal BCKB1.

Figure 6:
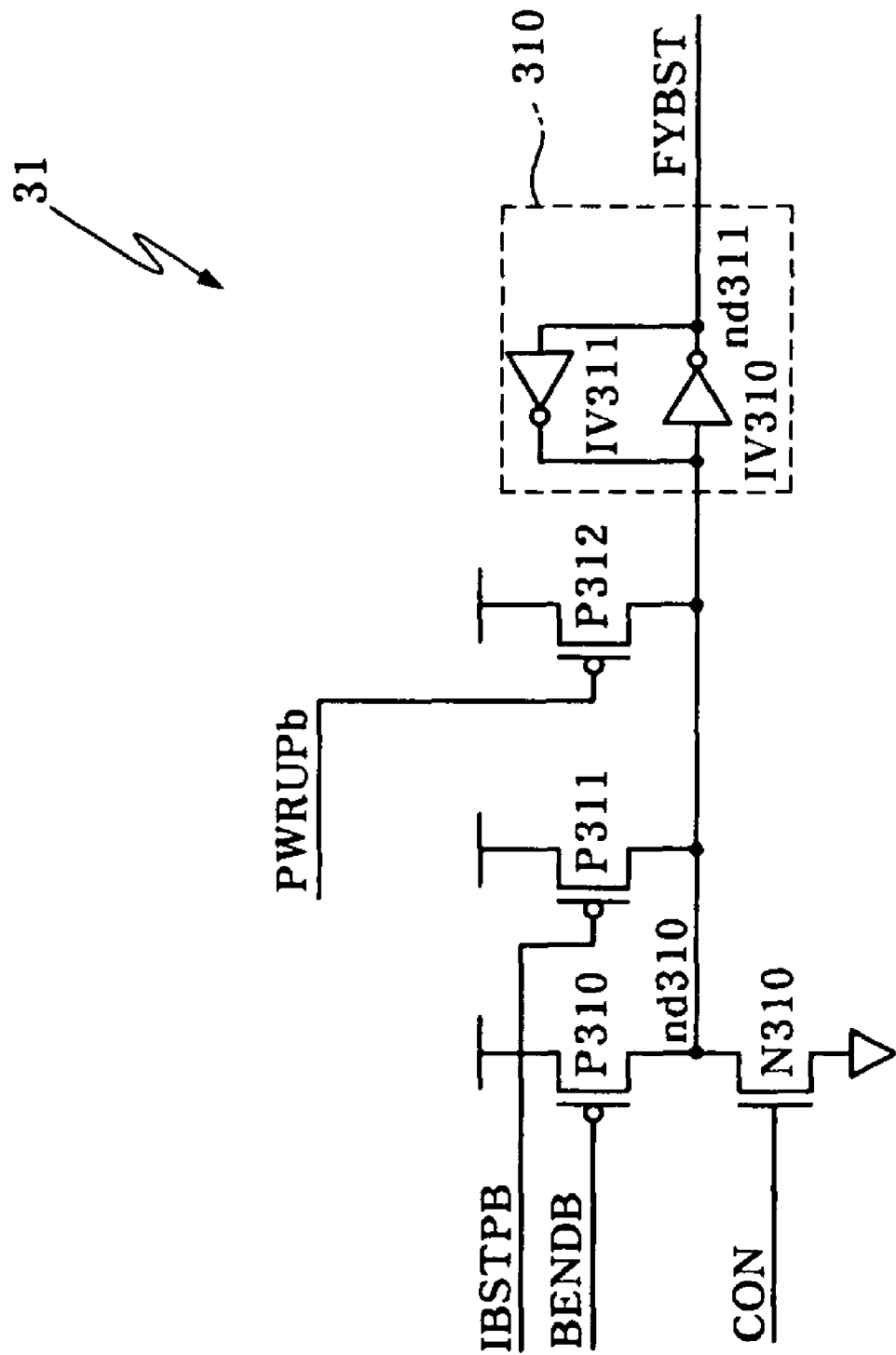
FIG. 6 is a detailed circuit diagram illustrating an example of a structure of a buffer control signal generating unit included in the control signal generating unit of FIG. 4.

As shown in FIG. 6, the buffer control signal generating unit 31 includes a NMOS transistor N310 for performing a pull-down operation at a node nd310 in response to the state signal CON, a PMOS transistor P310 for performing a pull-up operation at the node nd310 in response to a burst termination signal BENDB, a PMOS transistor P311 for performing a pull-up operation at the node nd310 in response to the interrupt signal IBSTPB, a PMOS transistor P312 for initializing the node nd310 to a high level in response to the power-up signal PWRUPb, and a latch unit 310 for producing the buffer control signal FYBST by latching signals on the nodes nd310 and nd311. Here, after the read signal IRDP or the write signal IWTP is input at a high level, the burst termination signal BENDB, which is generated by the burst termination signal generating unit 4, transits to a low level with the lapse of three periods (3tCK) of the first internal clock signal BCKB1 in the burst length of BL8 and transits to a low level with the lapse of seven periods (7tCK) of the first internal clock signal BCKB1 in the burst length of BL16. The interrupt signal IBSTPB, which is enabled at a low level, is applied from an external circuit in order to terminate the data I/O operation.

Figure 7:
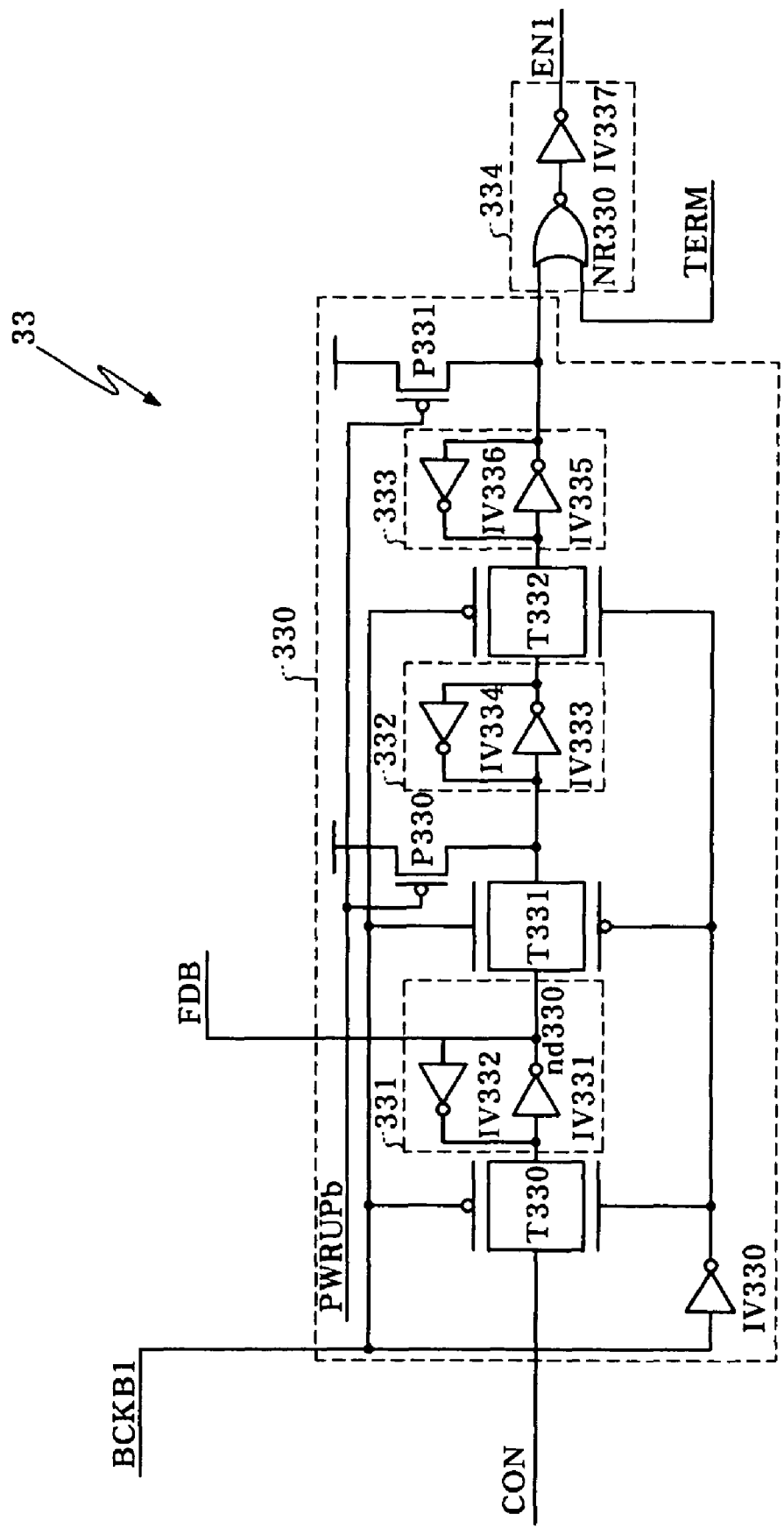
FIG. 7 is a detailed circuit diagram illustrating an example of a structure of a first enable signal generating unit included in the control signal generating unit of FIG. 4.

As shown in FIG. 7, the first enable signal generating unit 33 includes a first level shifter 330 and a logic unit 334. The first level shifter 330, which includes transfer gates T330, T331 and T332, latch units 331, 332 and 333 and PMOS transistors P330 and P331, shifts the state signal CON by a half period of the first internal clock signal BCKB1. The logic unit 334 performs an OR operation on an output signal of the latch unit 333 and the interrupt termination signal TERM. Here, the interrupt termination signal TERM is enabled at a high level when the interrupt signal IBSTPB is at a low level.

In a state where the interrupt termination signal TERM is at a low level, the first enable signal generating unit 33, which receives the state signal CON, shifts the received state signal CON by one and half period (1.5tCK) of the first internal clock signal BCKB1 and then outputs the shifted signal. Accordingly, a first enable signal EN1, which is generated by the first enable signal generating unit 33, is a signal which is produced by shifting the state signal CON by one and half period (1.5tCK) of the first internal clock signal BCKB1.

Figure 8:
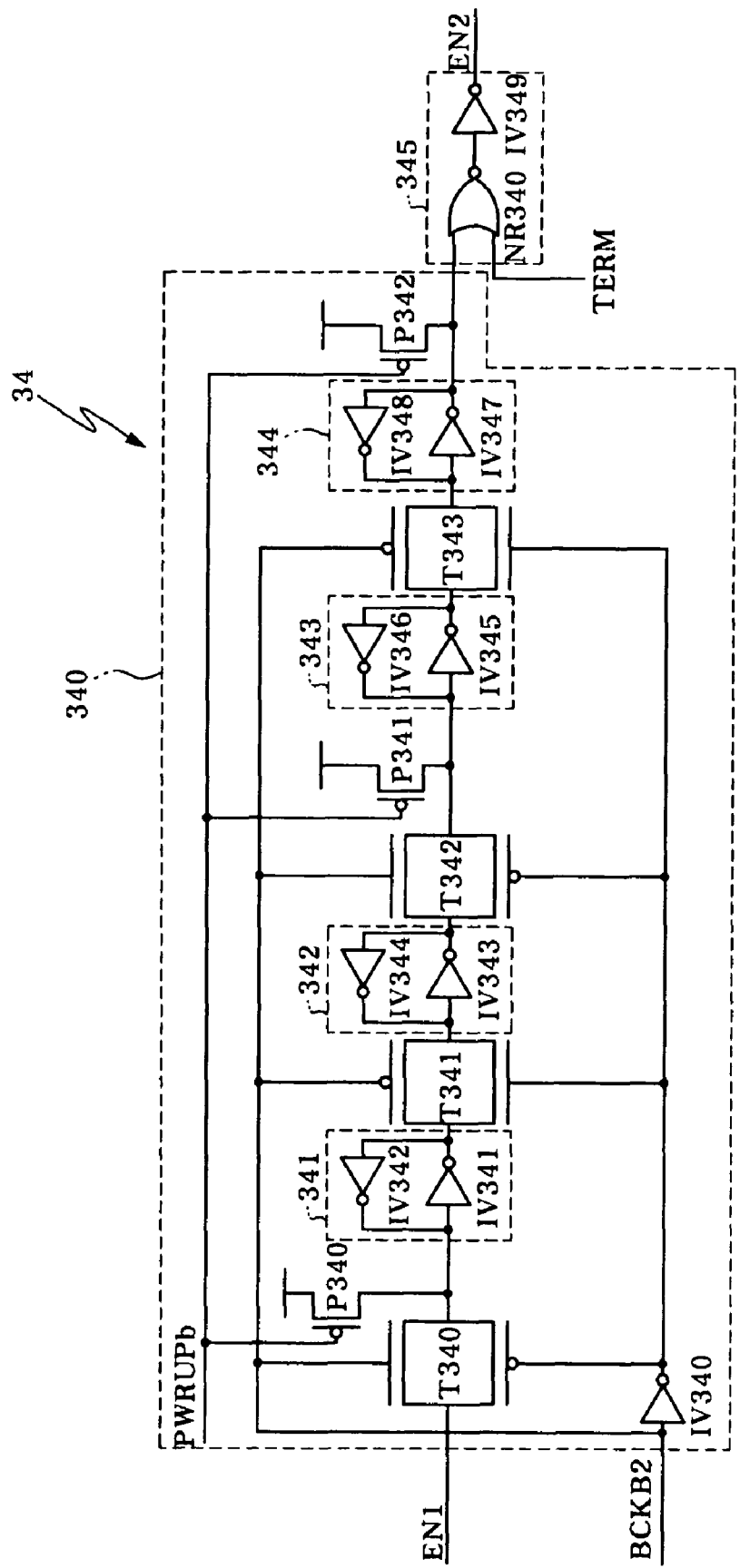
FIG. 8 is a detailed circuit diagram illustrating an example of a structure of a second enable signal generating unit included in the control signal generating unit of FIG. 4.

As shown in FIG. 8, the second enable signal generating unit 34 includes a second level shifter 340 and a logic unit 345. The second level shifter 340, which includes transfer gates T340, T341, T342 and T343, latch units 341, 342, 343 and 344 and PMOS transistors P340, P341 and P342, shifts the first enable signal EN1 by two periods of the second internal clock signal BCKB2. The logic unit 345 performs an OR operation on an output signal of the latch unit 344 and the interrupt termination signal TERM.

In a state where the interrupt termination signal TERM is at a low level, the second enable signal generating unit 34, which receives the first enable signal EN1, shifts the received first enable signal EN1 by two periods (2tCK) of the second internal clock signal BCKB2 and then outputs the shifted signal. Accordingly, a second enable signal EN2, which is generated by the second enable signal generating unit 34, is a signal which is produced by shifting the first enable signal EN1 by two periods (2tCK) of the second internal clock signal BCKB2.

Figure 9:
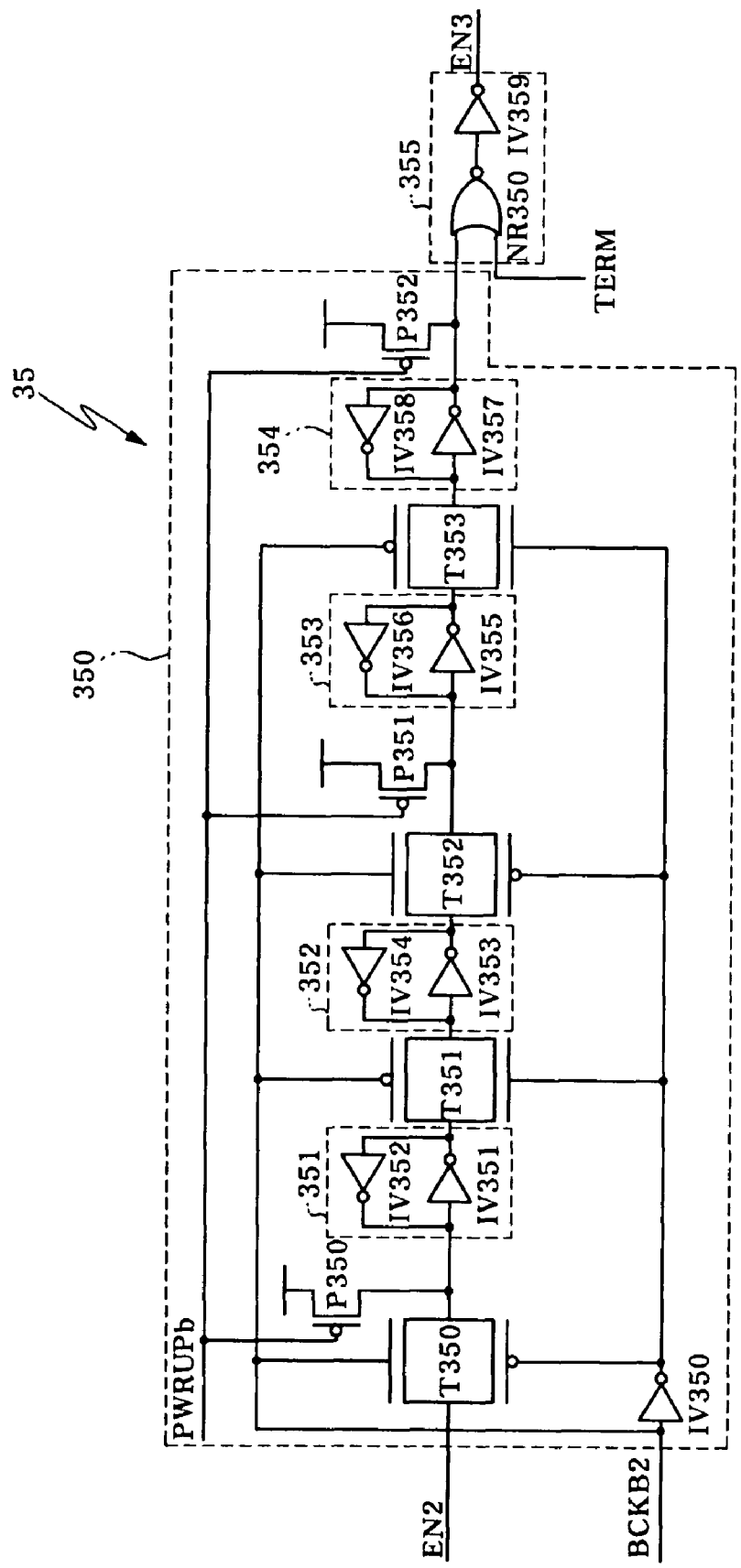
FIG. 9 is a detailed circuit diagram illustrating an example of a structure of a third enable signal generating unit included in the control signal generating unit of FIG. 4.

As shown in FIG. 9, the third enable signal generating unit 35 includes a third level shifter 350 and a logic unit 355. The third level shifter 350, which includes transfer gates T350, T351, T352 and T353, latch units 351, 352, 353 and 354 and PMOS transistors P350, P351 and P352, shifts the second enable signal EN2 by two periods of the second internal clock signal BCKB2. The logic unit 355 performs an OR operation on an output signal of the latch unit 354 and the interrupt termination signal TERM.

In a state where the interrupt termination signal TERM is at a low level, the third enable signal generating unit 35, which receives the second enable signal EN2, shifts the received second enable signal EN2 by two periods (2tCK) of the second internal clock signal BCKB2 and then outputs the shifted signal. Accordingly, a third enable signal EN3, which is generated by the third enable signal generating unit 35, is a signal which is produced by shifting the second enable signal EN2 by two periods (2tCK) of the second internal clock signal BCKB2.

Figure 10:
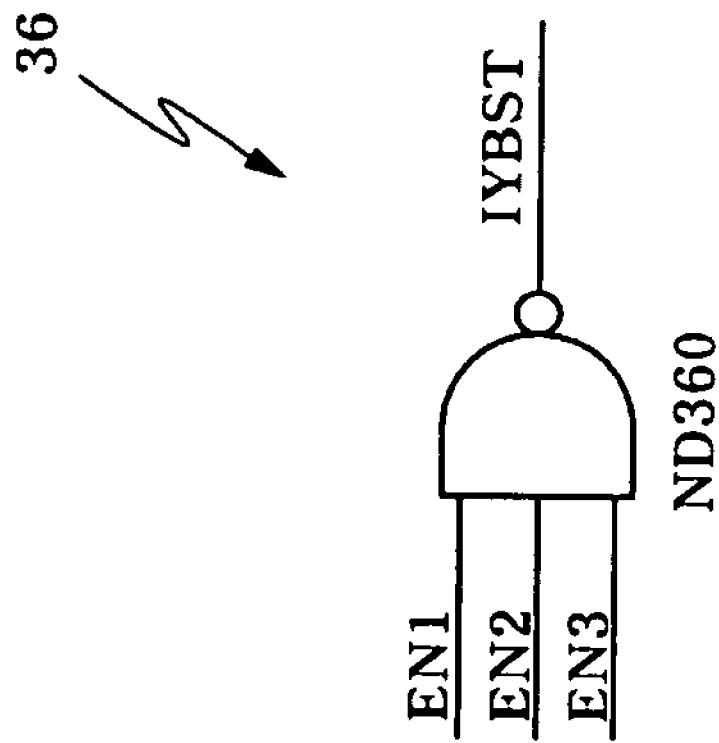
FIG. 10 is a detailed circuit diagram illustrating an example of a structure of a column control signal output unit included in the control signal generating unit of FIG. 4.

As shown in FIG. 10, the column control signal generating unit 36 includes a NAND gate ND360 to generate the column control signal IYBST by NANDing the first through third enable signals EN1 to EN3. In the case where at least one of the first through third enable signals EN1 to EN3 is at a high level, the column control signal generating unit 36 generates the column control signal IYBST which is enabled at a high level.

Figure 11:
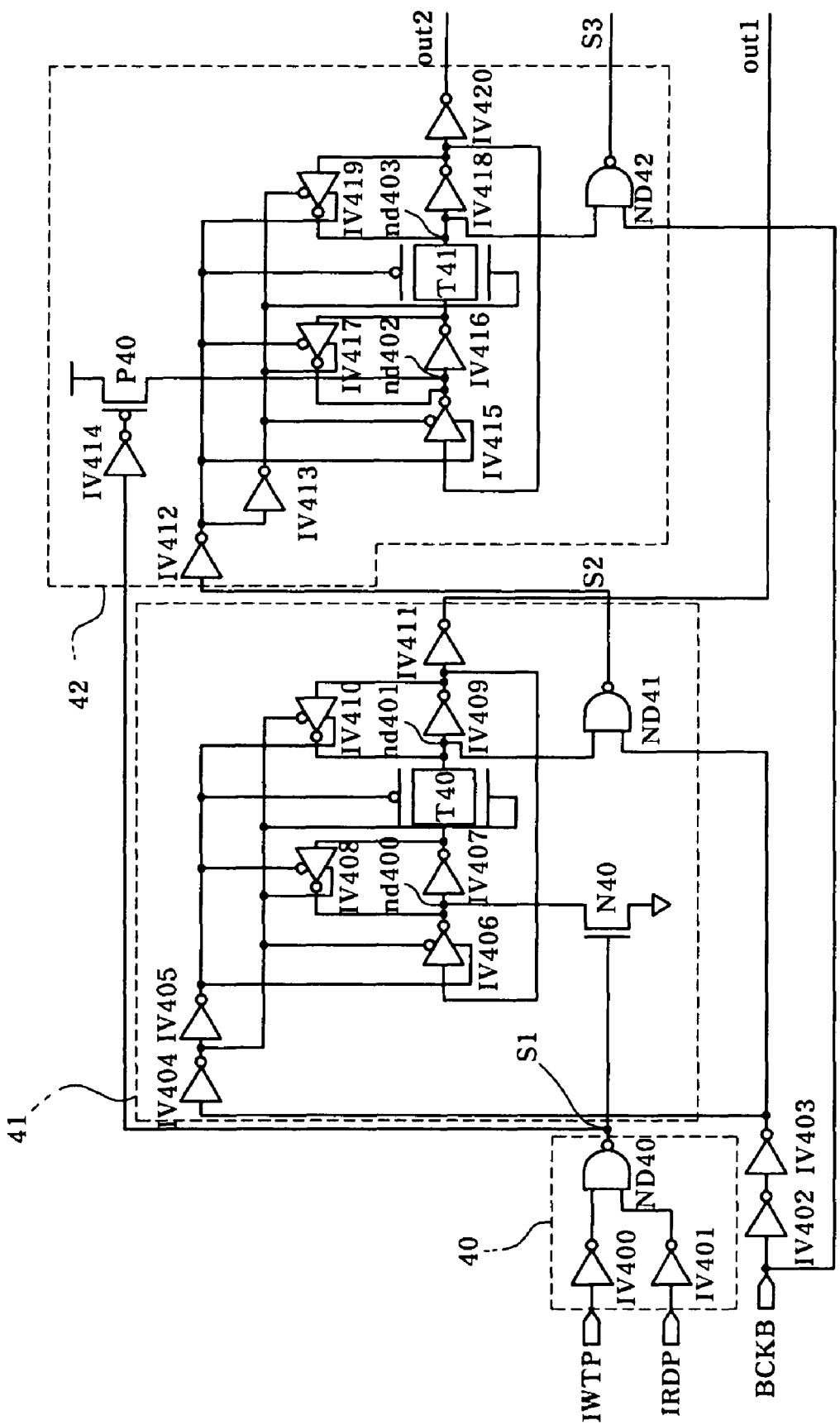
FIGS. 11 and 12 are circuit diagrams illustrating an example of a structure of a burst termination signal generating unit included in the burst length control circuit of FIG. 2.
Figure 12:
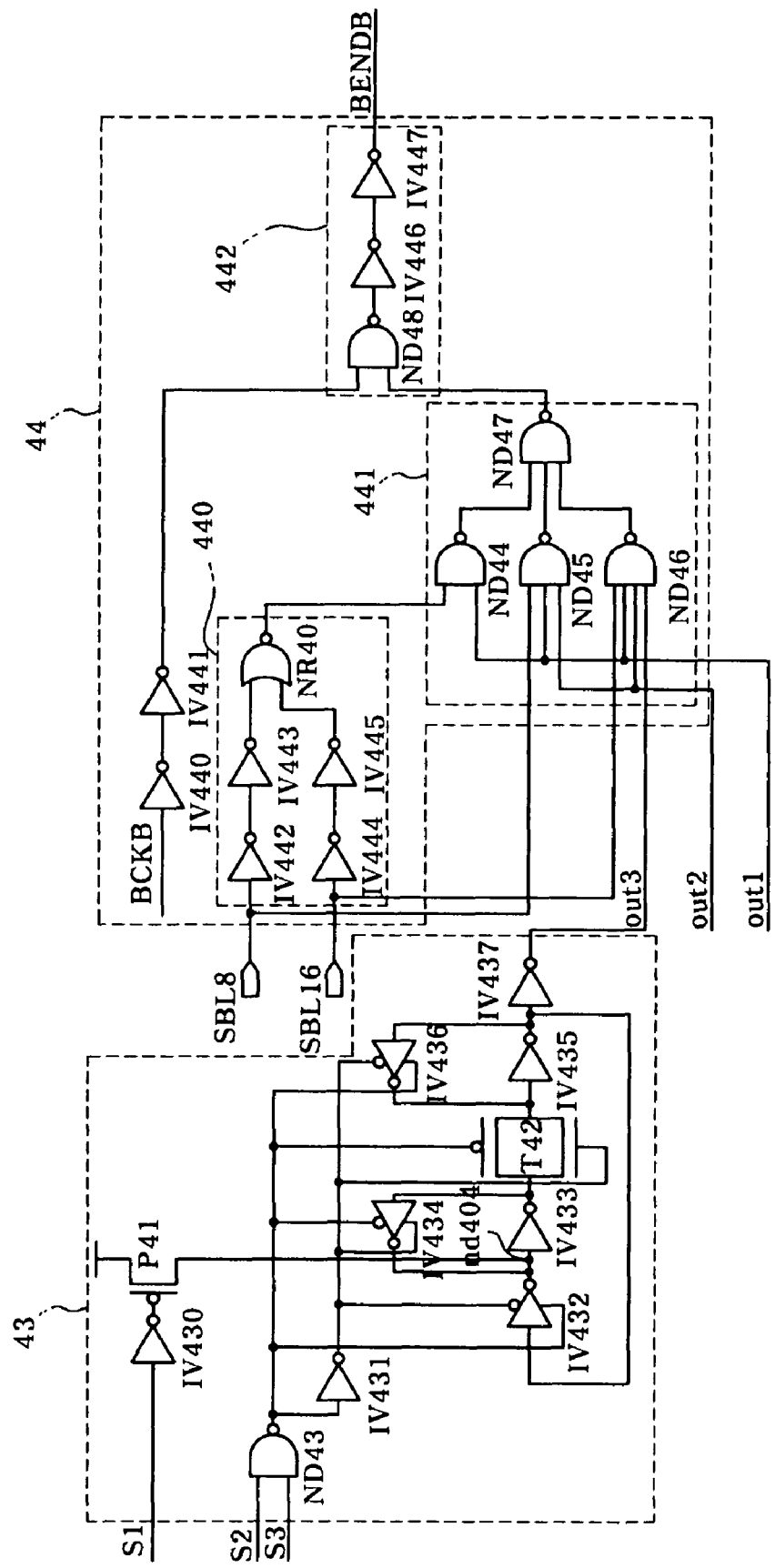

As shown in FIGS. 11 and 12, the burst termination signal generating unit 4 includes a signal input unit 40, a first period signal generating unit 41, a second period signal generating unit 42, a third period signal generating unit 43, and a time period determination unit 44.

The signal input unit 40 includes a NAND gate ND40 which generates a first signal S1 by NANDing inverted signals of the read signal IRDP and the write signal IWTP. In the case where the read signal IRDP or the write signal IWTP is input at a high level, the signal input unit 40 generates the first signal S1 which is enabled at a high level.

The first period signal generating unit 41 includes a NMOS transistor N40 for performing a pull-down operation at a node nd400 in response to the first signal S1, a plurality of inverters IV404 to IV410 for transferring a signal on the node nd400 in response to a buffered signal of the clock signal BCKB, a NAND gate ND41 for generating a second signal S2 by NANDing a signal on a node nd401 and a buffered signal of the clock signal BCKB, and an inverter IV411 for generating a first period signal outs by ibveting an output signal of the inverter IV409. A time period of the second signal S2 and the first period signal out1, which are generated by the first period signal generating unit 41, is twice as long as that of the clock signal BCKB, i.e., 2tCK.

The second period signal generating unit 42 includes a PMOS transistor P40 for performing a pull-up operation at a node nd402 in response to the first signal S1, a plurality of inverters IV412 to IV419 for transferring a signal on the node nd402 in response to the second signal S2, a NAND gate ND42 for generating a third signal S3 by NANDing a signal on a node nd403 and the clock signal BCKB, and an inverter IV420 for generating a second period signal out2 by inverting an output signal of the inverter IV418. A time period of the third signal S3 and the second period signal out2, which are generated by the second period signal generating unit 42, is four times as long as that of the clock signal BCKB, i.e., 4tCK.

The third period signal generating unit 43 includes a PMOS transistor P41 for performing a pull-up operation at a node nd404 in response to the first signal S1, a NAND gate ND43 for NANDing the second and third signals S2 and S3, a plurality of inverters IV431 to IV436 for transferring a signal on the node nd404 in response to an output signal of the NAND gate ND43, and an inverter IV437 for generating a third period signal out3 by inventing an output signal of the inverter IV435. A time period of the third period signal out3, which is generated by the third period signal generating unit 43, is five times as long as that of the clock signal BCKB, i.e., 5tCK.

The period determination unit 44 includes a logic unit 440 for NORing the first and second burst signals SBL8 and SBL16, a logic unit 441 for logically combining the first burst signal SBL8, the second burst signal SBL16, the first period signal out1, the second period signal out2, the third period signal out3, and an output signal of the logic unit 440, and a logic unit 442 for NANDing the output signal of the logic unit 440 and an output signal of the logic unit 441.

Since only the first burst signal SBL8 is enabled at a high level in the burst length of BL8, the first period signal outs and the second period signal out2 are output through the NAND gates ND45 and ND47 and the logic unit 442 in the period determination unit 44. Accordingly, the burst termination signal BENDB is enabled at a low level with the lapse of three periods (3tCK) of the clock signal BCKB after the read signal IRDP or the write signal IWTP is input at a high level. Meanwhile, the the case of the burst length of BL16, since only the second burst signal SBL16 is enabled at a high level, the first through third period signals out1, out2 and out3 are output through the NAND gates ND46 and Nd47 and the logic unit 442. Accordingly, the burst termination signal BENDB is enabled at a low level with the lapse of after seven periods (7tCK) of the clock signal BCKB after the read signal IRDP or the write signal IWTP is input at a high level.

Figure 13:
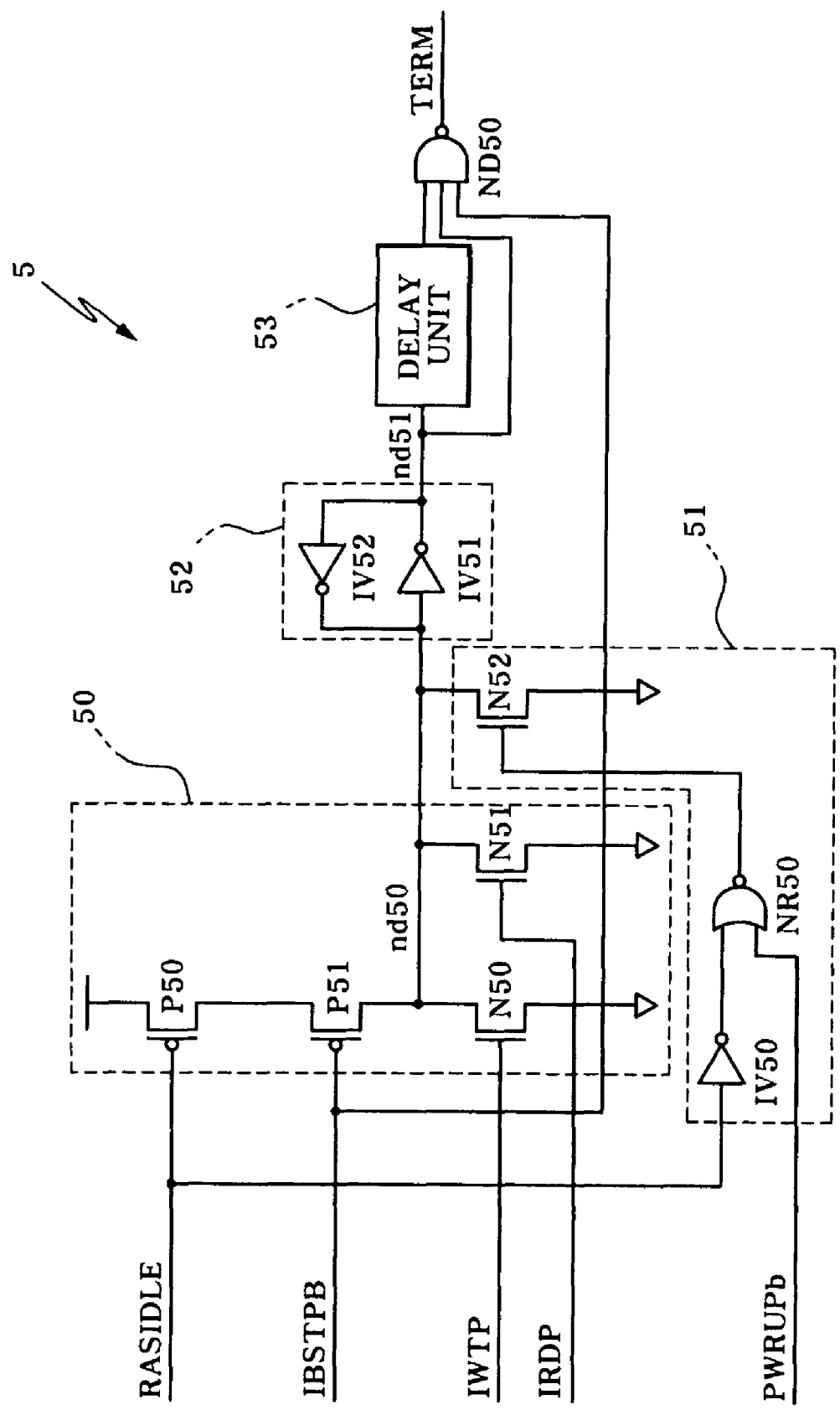
FIG. 13 is a circuit diagram illustrating an example of a structure of an interrupt termination signal generating unit included in the burst length control circuit of FIG. 2.
Figure 14:
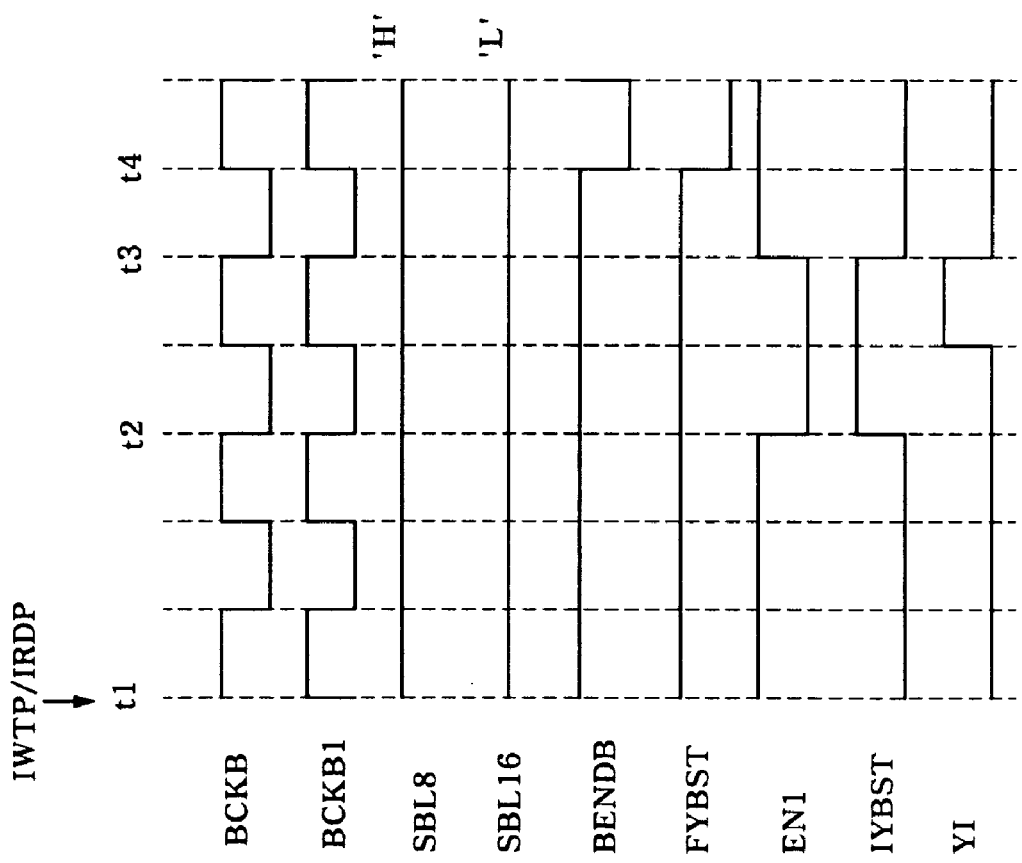
FIG. 14 is a timing chart for operation in a case of a burst length of BL8 in the burst length control circuit of FIG. 2.

As shown in FIG. 13, the interrupt termination signal generating unit 5 includes a termination signal driving unit 50, an initialization unit 51, a latch unit 52, a delay unit 53, and a NAND gate ND50. The termination signal driving unit 50 receives a RAS idle signal RASIDLE, the interrupt signal IBSTPB, the read signal IRDP and the write signal IWTP in an idle state of the semiconductor memory device and then drives a node nd50. The initialization unit 51 includes a NOR gate NR50 for performing a NOR operation an inverted signal of the RAS idle signal RASIDLE and the power-up signal PWRUPb, and a NMOS transistor N52 for initializing the node nd50 to a low level in response to an output signal of the NOR gate NR50. In this configuration, the interrupt termination signal generating unit 5 enables the interrupt termination signal TERM at a high level when the interrupt signal IBSTPB is applied from an external circuit in order to terminate the data I/O operation. Furthermore, when the read signal IRDP or the write signal IWTP is input in a state where the interrupt termination signal TERM is at a high level, the interrupt termination signal generating unit 5 disables the interrupt termination signal TERM at a low level after the delay time of the delay unit 53.

The buffer enable signal generating unit 60 drives the data I/O buffer 61 to enable the data I/O operation, by generating a buffer enable signal BUF_EN of a high level when the buffer control signal FYBST is input at a high level.

The column select signal generating unit 62 turns on the data I/O switch 63, by generating the column select signal YI of a high level when the column control signal IYBST is input at a high level. Here, the the data I/O switch 63 is coupled between a bit line sense amplifier (not shown) and the I/O line (not shown) and is turned for the data I/O operation.

The operation of the above-mentioned semiconductor memory device will be described in detail.

In the power-up section, the burst length control circuit 1 is initialized by the power-up signal which is enabled to a low level. That is, the state signal CON and the buffer control signal FYBST are initialized at a low level and the first through third enable signal EN1 to EN3 are initialized at a high level so that the column control signal IYBST is initialized at a low level. The burst mode operations will be described based on the burst lengths of BL4, BL8 and BL16.

First, the burst mode operation will be described based on the burst length of BL4.

In the burst length of BL4, since the clock signal generating unit 2 does not transfer the clock signal BCKB as the first internal clock signal BCKB1 and the second internal clock signal BCKB2, the state signal generating unit 30 and the enable signal generating unit 32, which are driven by the first internal clock signal BCKB1 and the second internal clock signal BCKB2, is not driven. Accordingly, the buffer control signal FYBST and the column control signal IYBST are maintained at a low level.

In the case where both the buffer control signal FYBST and the column control signal IYBST are at a low level, the data I/O buffer 61 is maintained at a disable state and the column select signal YI is not produced. Basically, in the case of DDR2 to which the 4-bit prefetch is applied, the 4-bit data are input and output through the data I/O buffer 61, regardless of the buffer control signal FYBST and the column control signal IYBST.

Hereinafter, the burst mode operation will be described based on the burst length of BL8.

In the burst length of BL8, the clock signal generating unit 2 transfers the clock signal BCKB, as the first internal clock signal BCKB1, even though it is not transferred as the second internal clock signal BCKB2. The state signal generating unit 30 and the first enable signal generating unit 33 are driven by the first internal clock signal BCKB1. However, since the second internal clock signal BCKB2 is enabled only in the the burst length of BL16, the second enable signal generating unit 34 and the third enable signal generating unit 35 are not driven. As a result, a current consumption is reduced by preventing unnecessary current from being caused.

First, in the case where the first burst signal SBL8 is input at a high level and the read signal IRDP or the write signal IWTP is input at a high level, the state signal generating unit 30 generates the state signal CON which is enabled at a high level during one period of the first internal clock signal BCKB1. When the state signal CON is transitsed to a high level, the buffer control signal FYBST is enabled at a high level. Furthermore, as illustrated above, since the burst termination signal BENDB, which is generated by the burst termination signal generating unit 4, is enabled at a low level with the lapse of three periods (3tCK) of the clock signal BCKB after the read signal IRDP or the write signal IWTP is input at a high level, the enablement of the buffer control signal FYBST is maintained during three periods (3tCK) of the clock signal BCKB.

Next, since the interrupt signal IBSTPB is not applied, the first enable signal generating unit 33 generates the first enable signal EN1 by shifting the state signal CON by one and half period (1.5tCK) of the first internal clock signal BCKB1 in a state where the interrupt termination signal TERM is at a low level.

The column control signal generating unit 36 generates the column control signal IYBST by inverting the first enable signal EN1. That is, the column control signal IYBST is maintained at a high level from the point of time of t2 to the point of time of t3 with the lapse of one and half period (1.5tCK, from t1 to t2) of the first internal clock signal BCKB1 after the read signal IRDP or the write signal IWTP is input at a high level at the point of time of t1.

When the column control signal IYBST is enabled at a high level during one period (1tCK) from the point of time of t2 to the point of time of t3, the column select signal generating unit 62 generates the column select signal YI to consecutively input and output the 4-bit data and the data I/O buffer 61 is enabled in order to consecutively input and output the 4-bit data before the burst termination signal BENDB, which is enabled at a low level at the point of time of t4, is input. As mentioned above, basically, in the DDR2 memory device to which the 4-bit prefetch is applied, since the 4-bit data is input and output through the data I/O buffer 61 regardless of the buffer control signal FYBST and column control signal IYBST, the 8-bit data is continuously input and output in the burst length of BL8.

Figure 15:
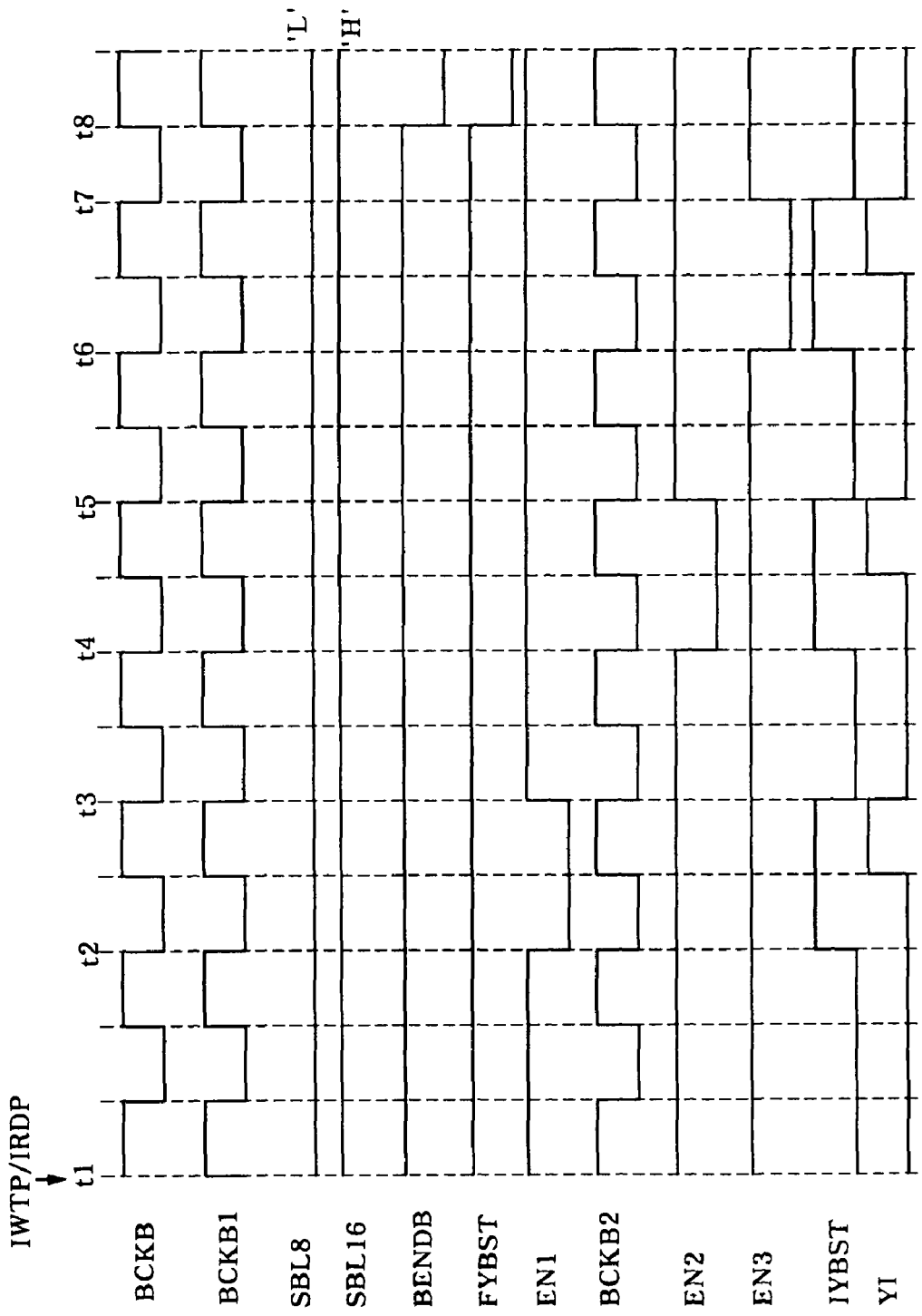
FIG. 15 is a timing chart for operation in a case of a burst length of BL16 in the burst length control circuit of FIG. 2.

Hereinafter, referring to FIG. 15, the burst mode operation will be described based on the burst length of BL16.

In the burst length of BL16, since the clock signal generating unit 2 transfers the clock signal BCKB as the first internal clock signal BCKB1 and the second internal clock signal BCKB2, the state signal generating unit 30, the first enable signal generating unit 33, the second enable signal generating unit 34, and the third enable signal generating unit 35 are driven.

First, in the case where the first burst signal SBL16 is input at a high level and the read signal IRDP or the write signal IWTP is input at a high level, the state signal generating unit 30 generates the state signal CON which is enabled at a high level during one period of the first internal clock signal BCKB1. When the state signal CON is transitsed to a high level, the buffer control signal FYBST is enabled at a high level. Furthermore, as illustrated above, since the burst termination signal BENDB, which is generated by the burst termination signal generating unit 4, is enabled at a low level with the lapse of seven periods (7tCK) of the clock signal BCKB after the read signal IRDP or the write signal IWTP is input at a high level, the enablement of the buffer control signal FYBST is maintained during seven periods (7tCK) of the clock signal BCKB.

Next, since the interrupt signal IBSTPB is not applied, the first enable signal generating unit 33 generates the first enable signal EN1 by shifting the state signal CON by one and half period (1.5tCK) of the first internal clock signal BCKB1 in a state where the interrupt termination signal TERM is at a low level. Since the interrupt signal IBSTPB is not applied, the second enable signal generating unit 34 generates the second enable signal EN2 by shifting the first enable signal EN1 by two periods (2tCK) of the second internal clock signal BCKB2 in a state where the interrupt termination signal TERM is at a low level. Since the interrupt signal IBSTPB is not applied, the third enable signal generating unit 35 generates the third enable signal EN3 by shifting the second enable signal EN2 by two periods (2tCK) of the second internal clock signal BCKB2 in a state where the interrupt termination signal TERM is at a low level.

The column control signal generating unit 36 generates the column control signal IYBST by using the first through third enabled signal EN1 to EN3. After the read signal IRDP or the write signal IWTP is input at a high level at the point of time of t1, the column control signal IYBST is maintained at a high level during one period of the first internal clock signal BCKB1 from the point of time of t2 to the point of time of t3 with the lapse of one and half period (1.5tCK, from t1 to t2) of the clock signal BCKB, maintained at a high level during one period (1tCK) of the clock signal BCKB from the point of time of t4 to the point of time of t5, and maintained at a high level during one period (1tCK) of the clock signal BCKB from the point of time of t6 to the point of time of t7.

When the column control signal IYBST is enabled at a high level during one period (1tCK) from the point of time of t2 to the point of time of t3, from the point of time of t4 to the point of time of t5, and from the point of time of t6 to the point of time of t7, the column select signal generating unit 62 generates the column select signal YI to consecutively input and output the 12-bit data and the data I/O buffer 61 is enabled in order to consecutively input and output the 12-bit data when the buffer control signal FYBST is enabled at a high level at the point of time of t8. As mentioned above, basically, in the DDR2 memory device to which the 4-bit prefetch is applied, since the 4-bit data is input and output through the data I/O buffer 61 regardless of the buffer control signal FYBST and column control signal IYBST, the 16-bit data is continuously input and output in the burst length of BL16.

As described above, the burst length control circuit according to the present embodiment can perform the read operation or write operation in a high speed by providing the burst length of BL16 to the DDR2 device through the control of enable section of the buffer control signal FYBST using the burst termination signal BENDB.

Although examples and exemplary embodiments of the present invention have been described for illustrative purposes, those skilled in the art will appreciate that various modifications, additions and substitutions are possible, without departing from the scope and spirit of the invention as disclosed in the accompanying claims.

The present disclosure claims priority to Korean application 10-2008-0097884, filed on Oct. 6, 2008, the entire contents of which are incorporated herein by reference.

What is claimed is:

1. A burst length control circuit comprising:
   a clock signal generating unit for generating first and second internal clock signals from a clock signal in response to first and second burst signals;
   a control signal generating unit for driving in response to the first and second internal clock signals, wherein the control signal generating unit for generating first and second control signals, enable sections of the first and second control signals being controlled according to the first and second burst signals at a read operation or write operation; and
   a burst termination signal generating unit for generating a burst termination signal in response to the first and second burst signals,
   wherein the first control signal is disabled in response to the burst termination signal.

2. The burst length control circuit of claim 1, wherein the clock signal generating unit for transferring the clock signal as the first internal clock signal when the first burst signal is enabled, and transfers the clock signal as the first and second internal clock signals when the second burst signal is enabled.

3. The burst length control circuit of claim 2, wherein the clock signal generating unit includes: a first transfer unit for transferring the clock signal as the first internal clock signal in response to the first and second burst signals; and
   a second transfer unit for transferring the clock signal as the second internal clock signal in response to the first and second burst signals.

4. The burst length control circuit of claim 1, wherein the control signal generating unit includes:
   a state signal generating unit for driving in response to the first internal clock signal, wherein the state signal generating unit for generating a state signal in response to the first and second burst signals and a read signal or write signal;
   a first control signal generating unit for configuring receive the state signal and the burst termination signal and then generates the first control signal;
   an enable signal generating unit for driving in response to the first and second internal clock signals, wherein the enable signal generating unit is configured to receive the state signal and then generates first through third enable signals; and
   a second control signal generating unit for configuring receive the first through third enable signals and then generate the second control signal.

5. The burst length control circuit of claim 4, wherein the state signal generating unit includes:
   a driving signal generating unit for configuring receive the first internal clock signal and the first and second burst signal and then generate a driving signal; and
   a state signal driving unit for driving a first node in response to the driving signal and the read signal or write signal.

6. The burst length control circuit of claim 5, wherein the driving signal generating unit includes:
   a first logic unit for performing a logic operation on the first internal clock signal and a feedback signal from the enable signal generating unit;
   a second logic unit for performing a logic operation on the first and second burst signals; and
   a third logic unit for performing a logic operation on output signals of the first and second logic units.

7. The burst length control circuit of claim 5, wherein the driving signal generating unit includes:
   a pull-up element for coupling between a supply voltage and the first node, wherein the pull-up element performs a pull-up operation at the first node in response to the driving signal;
   a switching element for coupling between the first node and a second node, wherein the switching element is turned on in response to the driving signal;
   a first pull-down element for coupling between the second node and the supply voltage, wherein the first pull-down element performs a pull-down operation at the second node in response to the read signal; and
   a second pull-down element for coupling between the second node and the supply voltage, wherein the first pull-down element performs a pull-down operation at the second node in response to the write signal.

8. The burst length control circuit of claim 4, wherein the first control signal generating unit includes:
   a pull-up element for coupling between a supply voltage and a first node, wherein the pull-up element performs a pull-up operation at the first node in response to the burst termination signal;
   a pull-down element for coupling between the first node and a ground voltage, wherein the pull-down element performs a pull-down operation at the first node in response to the state signal;
   an initialization element for coupling between the supply voltage and the first node, the initialization element initializes the first node in response to a power-up signal; and
   a latch unit for coupling between the first node and the second node.

9. The burst length control circuit of claim 4, wherein the enable signal generating unit includes:
   a first enable signal generating unit for generating the first enable signal by shifting the state signal in response to the first internal clock signal;
   a second enable signal generating unit for generating the second enable signal by shifting the first enable signal in response to the second internal clock signal; and
   a third enable signal generating unit for generating the third enable signal by shifting the second enable signal in response to the second internal clock signal.

10. The burst length control circuit of claim 9, wherein the first enable signal generating unit includes:
    a level shifter for shifting the state signal by a predetermined period of the first internal clock signal; and
    a logic unit for performing a logic operation on an output signal of the level shifter and an interrupt termination signal.

11. The burst length control circuit of claim 9, wherein the second enable signal generating unit includes:
    a level shifter for shifting the first enable signal by a predetermined period of the second internal clock signal; and
    a logic unit for performing a logic operation on an output signal of the level shifter and an interrupt termination signal.

12. The burst length control circuit of claim 9, wherein the third enable signal generating unit includes:
    a level shifter for shifting the second enable signal by a predetermined period of the second internal clock signal; and
    a logic unit for performing a logic operation on an output signal of the level shifter and an interrupt termination signal.

13. The burst length control circuit of claim 4, wherein the second control signal generating unit for generating the second control signal which is enabled when at least one of the first through third enable signals is enabled.

14. The burst length control circuit of claim 1, wherein the burst termination signal generating unit includes:
- a signal input unit for configuring receive a read signal or write signal and then generate a first signal in a case where the read signal or write signal is enabled;
- a first period signal generating unit for generating in response to the clock signal, a second signal and a first period signal by transferring a signal, which is driven in response to the first signal;
- a second period signal generating unit for generating in response to the second signal, a third signal and a second period signal by transferring the signal, which is driven in response to the first signal;
- a third period signal generating unit for generating in response to the second and third signals, a third period signal by transferring the signal, driven in response to the first signal; and
- a period determination unit for determining a period of enablement of the burst termination signal, using the first through third period signals, in response to the first and second burst signals.

15. The burst length control circuit of claim 14, wherein the period determination unit includes:
- a first logic unit for performing a logic operation on the first and second burst signals;
- a second logic unit for performing a logic operation on the first and second burst signals, an output signal of the first logic unit, and the first through third period signals; and
- a third logic unit for performing a logic operation on the output signal of the first logic unit and an output signal of the second logic unit.

16. The burst length control circuit of claim 1, further comprising an interrupt termination signal generating unit for generating an interrupt termination signal in response to an interrupt signal, wherein the interrupt termination signal is enabled when the interrupt signal is enabled.

17. A semiconductor memory device comprising:
- a burst length control circuit driven by at least one internal clock signal, wherein the burst length control circuit generates first and second control signals, enable sections of the first and second control signals being controlled according to a burst ode, in a read operation or write operation, and wherein the first control signal is disabled in response to a burst termination signal which is generated according to the burst mode; and
- a data I/O control unit for controlling a data I/O operation in response to the first and second control signals.

18. The semiconductor memory device of claim 17, wherein the burst length control circuit includes:
- a clock signal generating unit for generating first and second internal clock signals utilizing a clock signal, in response to a first and second burst signals for determining the burst mode;
- a control signal generating unit for driving in response to first and second internal clock signals, wherein the control signal generating unit for generating first and second control signals, enable sections of the first and second control signals being controlled according to the first and second burst signals in the read operation or write operation; and
- a burst termination signal generating unit for generating a burst termination signal in response to the first and second burst signals, wherein the first control signal is disabled in response to the burst termination signal.

19. The semiconductor memory device of claim 18, wherein the clock signal generating unit for transferring the clock signal as the first internal clock signal when the first burst signal is enabled and transfers the clock signal the first and second internal clock signals when the second burst signal is enabled.

20. The semiconductor memory device of claim 18, wherein the control signal generating unit includes:
- a state signal generating unit for driving in response to the first internal clock signal, wherein the state signal generating unit for generating a state signal in response to the first and second burst signals and a read signal or write signal;
- a first control signal generating unit for configuring receive the state signal and the burst termination signal and then generate the first control signal;
- an enable signal generating unit for driving in response to the first and second internal clock signals, wherein the enable signal generating unit is configured to receive the state signal and then generate first through third enable signals; and
- a second control signal generating unit for configuring to receive the first through third enable signals and then generate the second control signal.

21. The semiconductor memory device of claim 20, wherein the state signal generating unit includes:
- a driving signal generating unit for configuring receive the first internal clock signal and the first and second burst signal and then generate a driving signal; and
- a state signal driving unit for driving a first node in response to the driving signal and the read signal or write signal.

22. The semiconductor memory device of claim 20, wherein the first control signal generating unit includes:
- a pull-up element for coupling between a supply voltage and a first node, wherein the pull-up element performs a pull-up operation at the first node in response to the burst termination signal;
- a pull-down element for coupling between the first node and a ground voltage, wherein the pull-down element performs a pull-down operation at the first node in response to the state signal;
- an initialization element for coupling between the supply voltage and the first node, the initialization element initializes the first node in response to a power-up signal; and
- a latch unit for coupling between the first node and the second node.

23. The semiconductor memory device of claim 20, wherein the enable signal generating unit includes:
- a first enable signal generating unit for generating the first enable signal by shifting the state signal in response to the first internal clock signal;
- a second enable signal generating unit for generating the second enable signal by shifting the first enable signal in response to the second internal clock signal; and
- a third enable signal generating unit for generating the third enable signal by shifting the second enable signal in response to the second internal clock signal.

24. The semiconductor memory device of claim 20, wherein the second control signal generating unit for generating the second control signal which is enabled when at least one of the first through third enable signals is enabled.

25. The semiconductor memory device of claim 18, wherein the burst termination signal generating unit includes:
- a signal input unit for configuring receive a read signal or write signal and then generate a first signal;
- a first period signal generating unit for generating in response to the clock signal, a second signal and a first period signal by transferring a signal, which is driven by the first signal;
- a second period signal generating unit for generating in response to the second signal, a third signal and a second period signal by transferring the signal, driven by the first signal;
- a third period signal generating unit for generating in response to the second and third signals, a third period signal by transferring the signal driven by the first signal; and
- a period determination unit for determining a period of enablement of the burst termination signal, using the first through third period signals, in response to the first and second burst signals.

26. The semiconductor memory device of claim 17, wherein the data I/O control unit, includes:
- a buffer enable signal generating unit for generating a buffer enable signal to control a data I/O buffer in response to the first control signal; and
- a column select signal generating unit for generating a column select signal to control a data I/O switch in response to the second control signal.

\* \* \* \* \*